(12) United States Patent
Ziger et al.

(10) Patent No.: US 7,096,127 B2
(45) Date of Patent: Aug. 22, 2006

(54) MEASURING FLARE IN SEMICONDUCTOR LITHOGRAPHY

(75) Inventors: David Ziger, San Antonio, TX (US); Ralf Ziebold, Radebeul (DE); Frank Goodwin, Clifton Park, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/964,102

(22) Filed: Oct. 13, 2004

(65) Prior Publication Data

US 2006/0080046 A1 Apr. 13, 2006

(51) Int. Cl.
*G06F 19/00* (2006.01)

(52) U.S. Cl. ....................................... 702/32

(58) Field of Classification Search ............ 702/32–35, 702/182, 189; 438/157, 281; 430/5, 296; 257/355
See application file for complete search history.

(56) References Cited

U.S. PATENT DOCUMENTS

| | | | |
|---|---|---|---|
| 5,757,507 A | | 5/1998 | Ausschnitt et al. |
| 5,798,192 A | * | 8/1998 | King et al. ............... 430/5 |
| 5,902,703 A | | 5/1999 | Leroux et al. |
| 5,962,173 A | | 10/1999 | Leroux et al. |
| 6,301,008 B1 | | 10/2001 | Ziger et al. |
| 6,569,584 B1 | * | 5/2003 | Ho et al. ................. 430/5 |
| 6,800,403 B1 | | 10/2004 | Leroux et al. |

2005/0012928 A1 * 1/2005 Sezginer et al. ............ 356/401

OTHER PUBLICATIONS

Ausschnitt, C.P., "Distinguishing Dose from Defocus for In-line Lithography Control," SPIE, Mar. 1999, vol. 3677, pp. 140-147, Santa Clara, CA.

Leroux, P., et al., "Focus Characterization Using End of Line Metrology," IEEE Transactions on Semiconductor Manufacturing, Aug. 2000, vol. 13, No. 3, pp. 322-330.

Ziger, D., et al., "Understanding Optical End of Line Metrology," Opt. Eng., Jul. 2000, vol. 39, No. 7, pp. 1951-1957.

Ueno, A., et al., "Novel at-Design-Rule Via-to-Metal Overlay Metrology for 193-nm Lithography," IEEE Transactions on Semiconductor Manufacturing, vol. 17, No. 3 (Aug. 2004) pp. 311-318.

* cited by examiner

*Primary Examiner*—Bryan Bui
(74) *Attorney, Agent, or Firm*—Slater & Matsil L.L.P.

(57) ABSTRACT

Systems, methods, and lithography masks for measuring flare in semiconductor lithography. A layer of photosensitive material is exposed to a first test pattern and a second test pattern, the second test pattern comprising an opaque or attenuated region. The second test pattern is placed proximate features formed in a photosensitive material in a first exposure by the first test pattern, in a second exposure by the second test pattern on the same mask or a different mask. Alternatively, the second test pattern may be disposed proximate a portion of the first test pattern on a single mask using a single exposure. If flare exists in the optical system, the second test pattern causes line shortening in the features formed in the photosensitive material of the first test pattern. The line shortening can be measured to determine the effect of flare in the lithography system.

32 Claims, 6 Drawing Sheets

MEASURING FLARE IN SEMICONDUCTOR LITHOGRAPHY

CROSS-REFERENCE TO RELATED APPLICATIONS

This application relates to the following co-pending and commonly assigned U.S. patent application Ser. No. 10/964,376, filed concurrently herewith, entitled "Calibration of Optical Line Shortening Measurements," which application is hereby incorporated herein by reference.

TECHNICAL FIELD

The present invention relates generally to lithography of semiconductor devices, and more particularly to systems, masks, and methods for measuring flare.

BACKGROUND

Semiconductor devices are manufactured by depositing many different types of material layers over a semiconductor workpiece or wafer, and patterning the various material layers using lithography. The material layers typically comprise thin films of conductive, semiconductive and insulating materials that are patterned to form integrated circuits.

One type of semiconductor lithography involves placing a patterned mask between a semiconductor workpiece and using an energy source to expose portions of a resist deposited on the workpiece, transferring the mask pattern to the resist. The resist is then developed, and the resist is used as a mask while exposed regions of a material on the workpiece are etched away.

As semiconductor devices are scaled down in size, lithography becomes more difficult, because light can function in unexpected and unpredictable ways when directed around small features. Several phenomenon of light can prevent the exact duplication of a mask pattern onto a wafer, such as diffraction or interference, as examples.

One problem that occurs in semiconductor lithography is referred to in the art as flare. Flare in optical systems is caused by the scattering of light, typically caused by a lens or other component of the optical system. If a lens is imperfect, light bounces off in different directions and is not periodic, rather than passing through the lens in a straight line, resulting in flare. Flare may be caused by non-uniformity in a lens material, for example. In microlithography, flare decreases manufacturing process windows by exposing resist in unintended areas, causing line shortening, which is an effect where features are made shorter than intended, and feature erosion, which is a thinning of the feature height as it transferred into the resist. Flare decreases the depth of focus (DOF), thus decreasing the process latitude. Consequently, it is critical to measure and minimize flare in order to increase process windows in semiconductor lithography.

One method used to quantify flare is referred to in the art as a Kirk test, in which the ratio of doses required to expose and develop a masked and unmasked area is computed. This method requires optical inspection, usually manual, to detect the dose at which a feature of known mask size is cleared. Other techniques rely on a scanning electron microscope (SEM) to determine the change in line-width in regions in proximity to variable degrees of opening in a chrome mask.

A disadvantage of current methods of measuring flare in lithography systems is that the methods rely on manual optical inspection or SEM measurement. These methods are difficult to automate and are time-consuming, and involve a degree of subjectivity.

Thus, improved methods of measuring flare in semiconductor lithography systems are needed in the art.

SUMMARY OF THE INVENTION

These and other problems are generally solved or circumvented, and technical advantages are generally achieved, by preferred embodiments of the present invention, which provide novel methods, masks, and systems for measuring flare. A flare sensitive test pattern is patterned on a photosensitive material on a wafer, and an opaque test pattern is patterned on the photosensitive material close to a first region of the flare sensitive test pattern, yet farther from a second region of the flare sensitive test pattern. The amount of flare is determined by measuring the patterned region of the test pattern close to the opaque test pattern compared to the patterned region of the test pattern farther from the opaque test pattern. The difference represents the amount of flare in the optical system. A wafer may be exposed to the test patterns using a double exposure and one or two lithography masks in some embodiments, or using a single exposure and one lithography mask in other embodiments.

In accordance with a preferred embodiment of the present invention, a method of measuring the effect of flare on lithography for semiconductor devices includes providing a semiconductor workpiece, the workpiece comprising a layer of photosensitive material disposed thereon, and exposing the layer of photosensitive material to energy through at least one mask, the at least one mask comprising a first test pattern and a second test pattern disposed proximate a portion of the first test pattern, the second test pattern comprising an opaque or attenuated region. The layer of photosensitive material is developed, and features formed on the photosensitive material by the first test pattern proximate the second test pattern are measured to determine the effect of flare.

In accordance with another preferred embodiment of the present invention, a lithography mask includes a transparent material, and an opaque material disposed over the transparent material, the opaque material comprising at least one first test pattern and at least one second test pattern, the at least one second test pattern comprising an opaque or attenuated region, wherein the at least one second test pattern provides a measurement of flare to a feature formed on a layer of photoresist by the at least one first test pattern.

In accordance with yet another preferred embodiment of the present invention, a lithography system includes a first mask comprising a first test pattern, the first test pattern comprising a plurality of gratings, and a second mask comprising a second test pattern, the second test pattern comprising an opaque or attenuated region. The lithography system includes an energy source for exposing the photosensitive material on the workpiece to the first test pattern of the first mask and the second test pattern of the second mask, and a stepper for positioning the first mask and second mask over a workpiece, the workpiece having a layer of photosensitive material disposed thereon. The stepper is adapted to position the second test pattern of the second mask asymmetrically over features formed on the layer of photosensitive material by the first test pattern of the first mask, wherein features formed on the photosensitive material may be measured to determine the effect of flare in the lithography system.

In accordance with yet another preferred embodiment of the present invention, a lithography system includes a single mask comprising one test pattern, the test pattern defined by variations of transparent and opaque or attenuated regions.

The flare of the lithography system increases the background intensity of the light within the ideally opaque areas of the aerial image. The effect of this is a profile degradation of the test pattern as it is transferred into the layer of photosensitive material on the workpiece. The variations of the transparent and opaque or attenuated regions of the test pattern and the flare of the lithography system results in asymmetric imaging of the test pattern onto the workpiece that can be optically detected.

Advantages of embodiments of the invention include providing novel methods and structures for measuring the effects of flare on semiconductor lithography. The flare measurements may be made using a double exposure in some embodiments, or a single exposure in other embodiments. A single mask may be used in some embodiments, or two masks may be used, in other embodiments. The methods described herein may be measured using commercially available optical alignment tools. In one embodiment, calibration to a SEM is not required, because a grating structure is not used for the test pattern.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a method of characterizing and measuring flare in lithography systems for semiconductor devices. The invention may also be applied, however, to other technologies that require lithography in the manufacturing process, for example.

Figure 1:
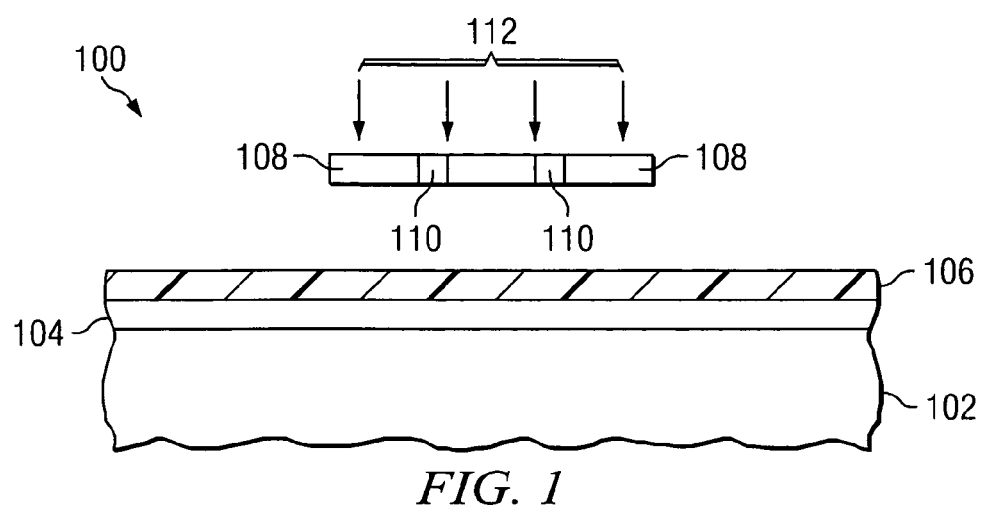
FIG. 1 illustrates a lithography system for patterning semiconductor wafers, in which embodiments of the present invention may be implemented.

With reference now to FIG. 1, there is shown a typical lithography system 100 in which embodiments of the present invention may be implemented. A workpiece 102 comprises a semiconductor wafer and has a material layer to be patterned 104 formed thereon. A layer of photosensitive material 106 such as a resist is disposed over the material layer 104. A lithography mask 108 comprising transparent and opaque areas that form a pattern 110 is placed between an energy source 112 such as light, for example, and the workpiece 102 in order to pattern the photosensitive material 106 with the pattern 1 10 on the mask 108. The mask 108 and/or workpiece 102 may be supported and moved by a stepper (not shown) to expose one or more portions of the workpiece 102 at a time.

Figure 2:
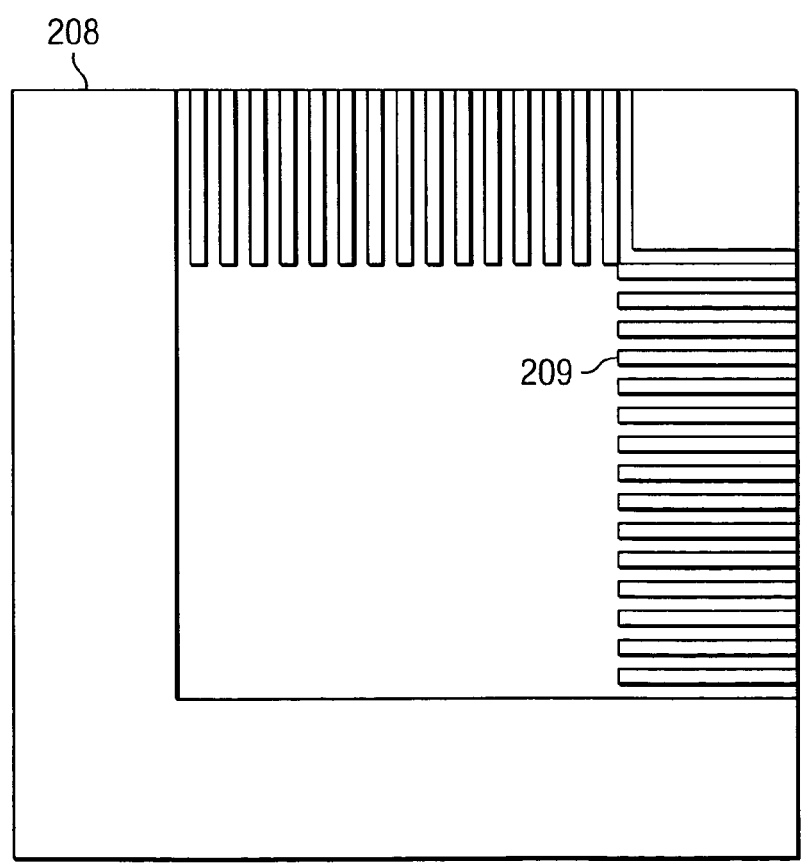
FIG. 2 shows a prior art lithography mask for measuring focus, having a box in box structure and gratings on two sides.

Box-in-box test patterns such as the one shown in prior art FIG. 2 have been used to measure focus, as described in the article entitled, "Focus Characterization Using End of Line Metrology," by Leroux et al., in IEEE Transactions on Semiconductor Manufacturing, Vol. 13, No. 3, August 2000, pp. 322–330, which is incorporated herein by reference. The pattern 209 of the mask 208 comprises a grating on the top and right edges of a box-in-box pattern. The gratings comprise a plurality of lines that are of a dimension that is smaller than the wavelength of the measuring tool. The lines and spaces are near or below the resolution of the stepper.

Figure 3:
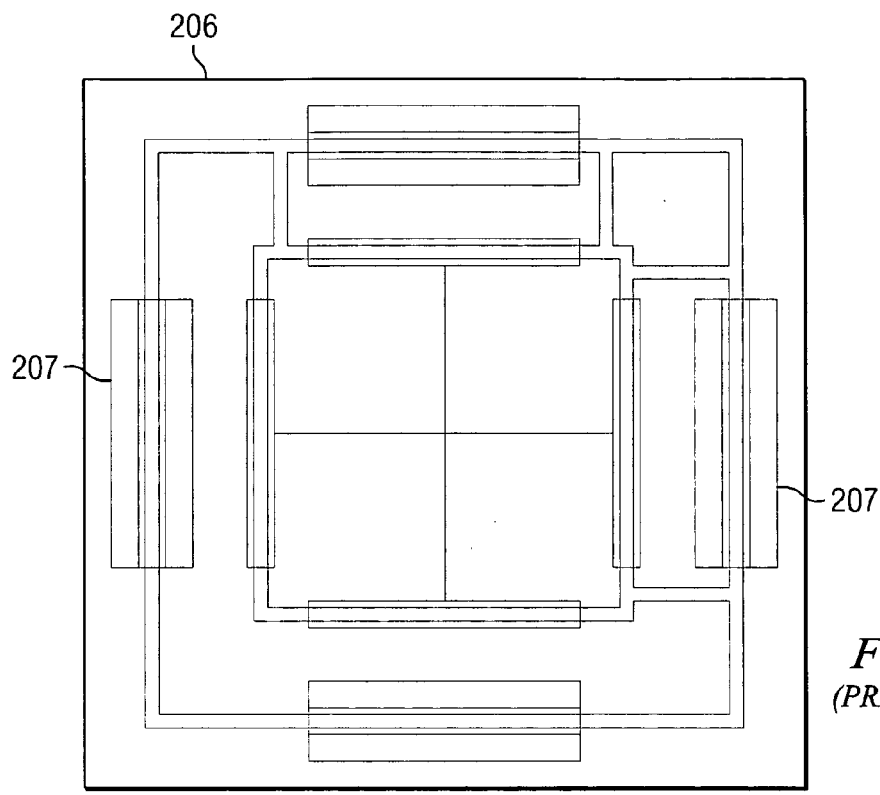
FIG. 3 shows a prior art optical view of a semiconductor wafer patterned using the lithography mask shown in FIG. 2.

FIG. 3 shows an optical view of the pattern 209 of FIG. 2 after it is printed or patterned on a workpiece 206. A problem with the test method shown in FIGS. 2 and 3 is that an optical tool interprets the ends of the sub-resolution grating as a solid line, as shown at the 207. The ends of lines of a grating are not resolved if the measuring wavelength is much larger than the pitch or dimensions of the grating. Because the lines and spaces of the grating on the mask 208 are smaller than the wavelength of light used in an optical microscope, the pattern formed on the workpiece 206 is not visible by an optical tool and cannot be seen. For example, the lines and spaces of the pattern 209 may be about 0.12 to 0.15 μm, and white light used in an optical microscope to view the workpiece 206 may comprise a wavelength of about 650 nm or less, which is too large to resolve the pattern. However, a SEM can detect and see the pattern formed on the workpiece 206, and thus a SEM must be used to resolve the pattern on the workpiece 206.

Embodiments of the present invention provide novel masks, methods, and systems of measuring flare in lithography systems.

Figure 4:
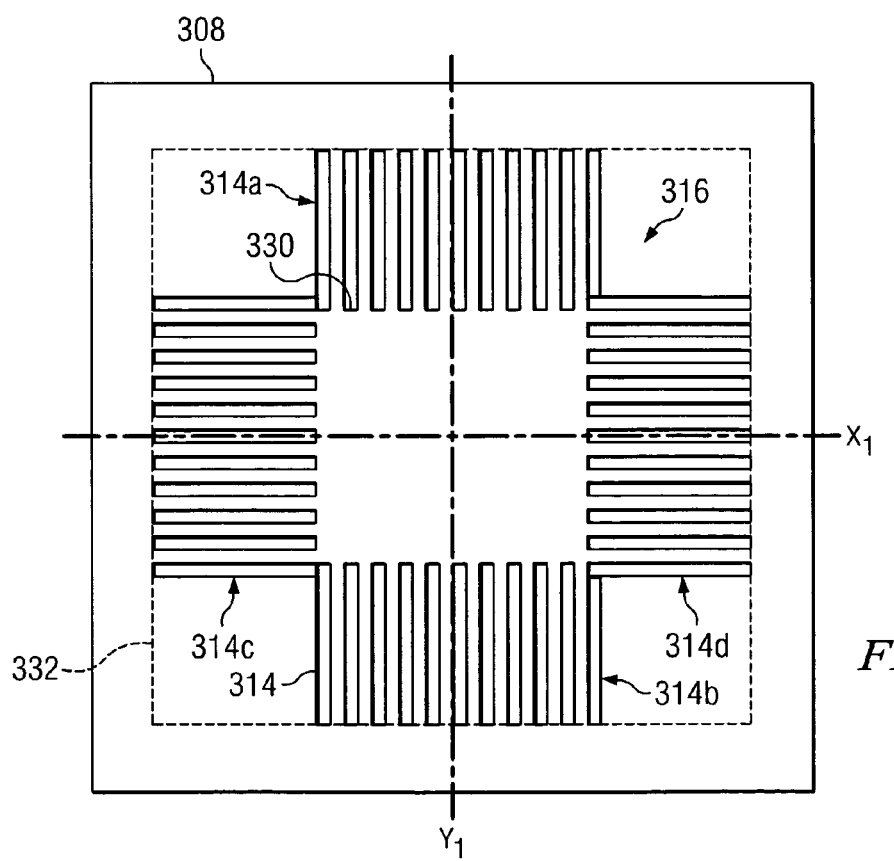
FIG. 4 shows a lithography mask in accordance with a preferred embodiment of the present invention, including a flare-sensitive patterned formed thereon.
Figure 5:
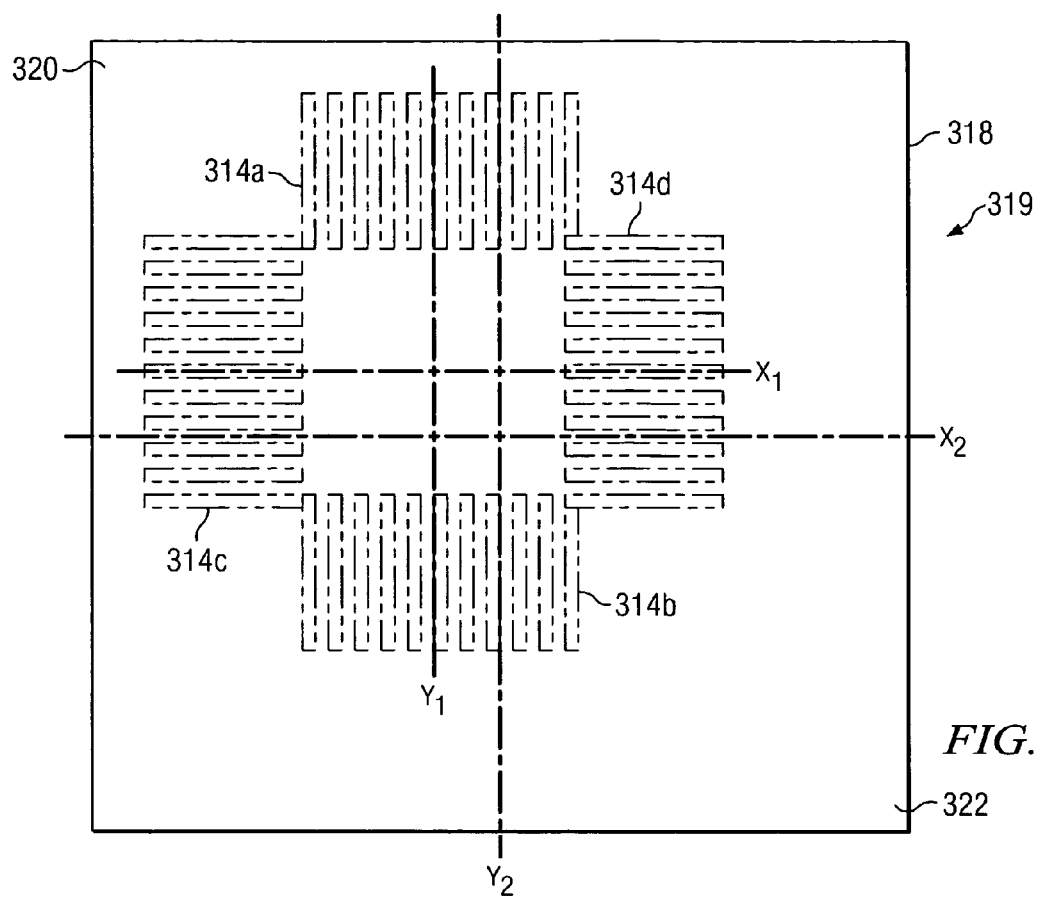
FIG. 5 shows a lithography mask having an opaque test pattern formed thereon, that is used for a second exposure, after a first exposure with the lithography mask shown in FIG. 4.

In a first embodiment of the present invention, a resist 306 disposed on a workpiece (see FIG. 6) is exposed to a first mask 308, as shown in FIG. 4, and then the resist 306 is exposed to a second mask 319, as shown in FIG. 5, before developing the resist 306. In accordance with this embodiment of the invention, a test pattern is formed on a resist 306 disposed on a workpiece using a double exposed grating box-in-box pattern.

The first mask 308 comprises a first test pattern 316 comprising a plurality of gratings 314, as shown. The gratings 314 preferably are arranged in a top row 314a, a bottom row 314b, a left column 314c and a right column 314d. Each row 314a and 314b and column 314c and 314d comprise a plurality of gratings 314, as shown. The gratings 314 define a first box 330 located central to the gratings 314 and a second box 332 disposed around the gratings 314. The gratings 314 of the first test pattern 316 are formed about central axes $x_1$ and $y_1$, as shown. The gratings 314 preferably comprise a flare-sensitive pattern, for example. In particular, the ends of the gratings 314 are very sensitive to flare effects.

The gratings 314 of the first mask 308 may comprise a minimum feature size of a lithography system, for example. The gratings 314 of the first test pattern 316 may comprise a width of about 0.12 μm or less, and may be spaced apart from one another by about 0.12 μm or less, although alternatively, the gratings 314 may comprise other dimensions, for example. The gratings 314 may comprise a length of about 9 μm or less, although alternatively, the gratings 314 may comprise other dimensions. The gratings 314 preferably comprise a plurality of parallel opaque regions in an otherwise transparent mask. The first mask 308 may comprise a substantially transparent substrate, such as quartz or glass, and an opaque material such as chrome, from which the gratings 314 are formed, disposed over the substrate (not shown), although alternatively, the first mask 308 may comprise other materials.

In accordance with an embodiment of the present invention, a resist 306 (see FIG. 6) covered wafer is patterned using the first mask 308 using an exposure tool, e.g., operating at about 193 nm or less. The latent image in the resist 306, i.e., the distribution of the photoactive chemical species, is symmetric at this point in the lithography process, and substantially resembles the first test pattern 316 of the first mask 308.

Next, the resist 306 is exposed a second time using the second mask 319 shown in FIG. 5. The second mask 319 comprises a second test pattern 318 comprising an opaque or attenuated box-shaped region or pattern that covers the latent image in the resist 306 asymmetrically. For example, the opaque test pattern 318 is substantially square and is larger than the plurality of gratings 314 of the first mask 308, as shown. The opaque test pattern 318 may be larger than the first test pattern 316 by about 10 μm or less on each side, for example. The opaque test pattern 318 is preferably not centered at the axes $x_1$ and $y_1$ of the first test pattern 316 latently formed in the resist 306, but rather, the opaque test pattern 318 is preferably centered about axes $x_2$ and $y_2$, as shown.

In the presence of flare, the top and left portions of the resist 306, e.g., proximate corner 320 of the second mask 318, will be much more exposed to scattered light or flare than the right and bottom portions of the resist 306, e.g., proximate corner 322 of the second mask 318. Thus, the top row of gratings and the left column of gratings in the first test pattern latently formed on the resist 306 will be exposed more than the bottom row of gratings and the right column of gratings on the resist 306. Thus, the exposure of the resist 306 is asymmetric after the second exposure.

Figure 6:
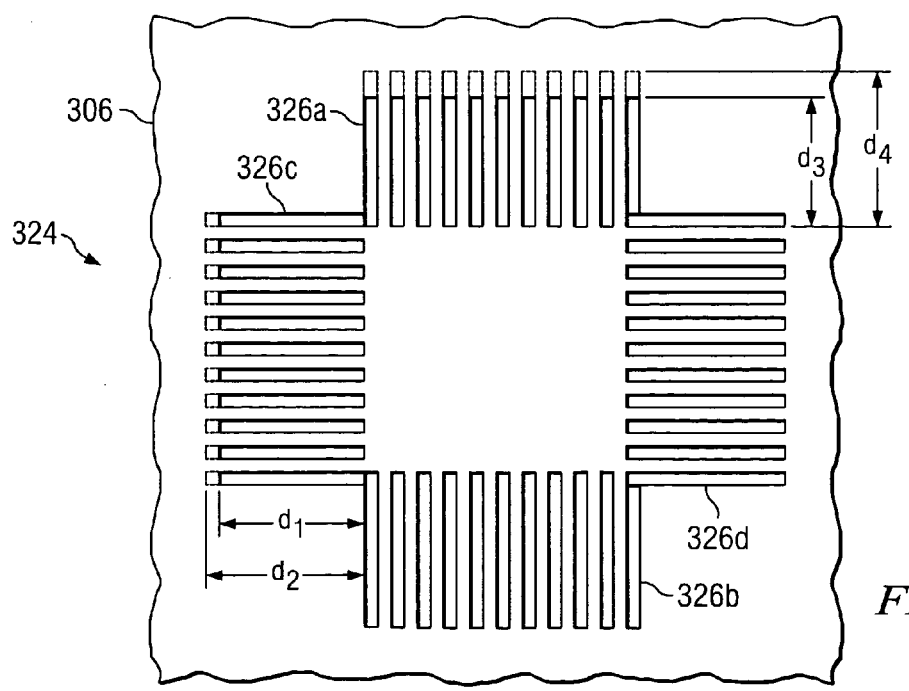
FIG. 6 shows a semiconductor wafer patterned with a double exposure using the two lithography masks shown in FIGS. 4 and 5.

After development of the resist 306, as shown in FIG. 6, the patterned gratings 324 on the resist 306 (e.g., the plurality of gratings 326a, 326b, 326c, and 326d) are then measured using an alignment tool. Commercially available optical alignment tools and optical metrology equipment may be used to measure the patterns formed on the resist 306, for example. The optical tool will measure the flare of the optical system as an effective shift in alignment, negative in the horizontal direction and positive in the vertical direction.

For example, if flare is present in the system, because the top left corner of the resist 306 was exposed to flare using the opaque test pattern 318 of the second mask 319, the grating features in the left column 326c comprise dimension $d_1$ rather than $d_2$, and the grating features in the top row 326a formed on the resist 306 comprise dimension $d_3$ rather than $d_4$. For example, the gratings 326c are shortened at the left ends, due to flare, and the gratings 326a are shortened at the top ends, as shown. Preferably, all of the grating patterns on the first mask 308 have the same length, so that $d_2=d_4=$the length of the gratings in the bottom row 326b and right column 326d; thus, the bottom row features 326b and right column features 326d may be measured and compared to the shortened left column features 326c and top column features 326a.

After the second exposure, the gratings are measured optically using an optical metrology tool, and the lengths of the gratings 326a, 326b, 326c, and 326d are compared to determine if there was line shortening. In one embodiment, measurements of the dimensions $d_1$ and $d_3$ of the features exposed to flare on the resist are compared to the dimensions of the gratings 314a and 314c on the first mask 308. However, in another embodiment, the dimensions $d_1$ and $d_3$ of the features exposed to flare on the resist are compared to measured dimensions of other features not exposed to flare, on the resist, e.g., the right column and bottom row of features formed by gratings 314b and 314d.

Note that the resist may be asymmetrically exposed with the second test pattern 318 in any corner of the latent first test pattern 316 formed on the resist. For example, if the second test pattern 318 is positioned more towards the right bottom corner of the latent first test pattern formed on the resist, the bottom row of gratings 326b would be shortened at the bottom edges of the gratings 326b, and the right column of gratings 326d would be shortened at the right edges of the gratings 326d, if there is flare in the system.

The optical lithography tool sees the line shortening (e.g., shortened $d_1$ and $d_3$) as a misalignment; in particular, the optical lithography tool determines that the inner box of the test pattern is misaligned, compared to the outer box (see inner box 330 and outer box 332 shown in FIG. 4). The misalignment reported by the optical lithography tool is related to the amount of flare in the lithography system. In accordance with embodiments of the present invention, the lithography system is preferably calibrated to determine the amount of flare the misalignment represents, using a calibration method such as the one described in U.S. patent application, Ser. No. 10/964,376, filed concurrently herewith, entitled "Calibration of Optical Line Shortening Measurements," which is incorporated herein by reference. Alternatively, other calibration methods may be used to quantify the amount of flare the detected misalignment represents, for example.

Simulations were performed to model the sensitivity of the embodiment of the invention shown in FIGS. 4 through 6 to various degrees of flare. The simulation results shown in FIG. 7 demonstrate that end of line shortening is dependent on the magnitude and effective flare distance, as well as exposure variables such as the dose and overlap used. The simulation conditions for FIGS. 7 and 8 were for a UV210 resist having a thickness of 0.55 µm, an annular illumination of 0.5/0.75, and a wavelength $\lambda=248$ nm. Fourteen pupil mesh points were used to enlarge the simulation region. The simulation variables included a second exposure dose at 20–60 mJ/cm$^2$, a flare roughness of 0.0 to 0.4, a flare width of 0.2 to 0.4, and an overlap of 0.0 to 0.4 µm. FIG. 8 shows interaction plots of the variables shown in FIG. 7.

Figure 7:
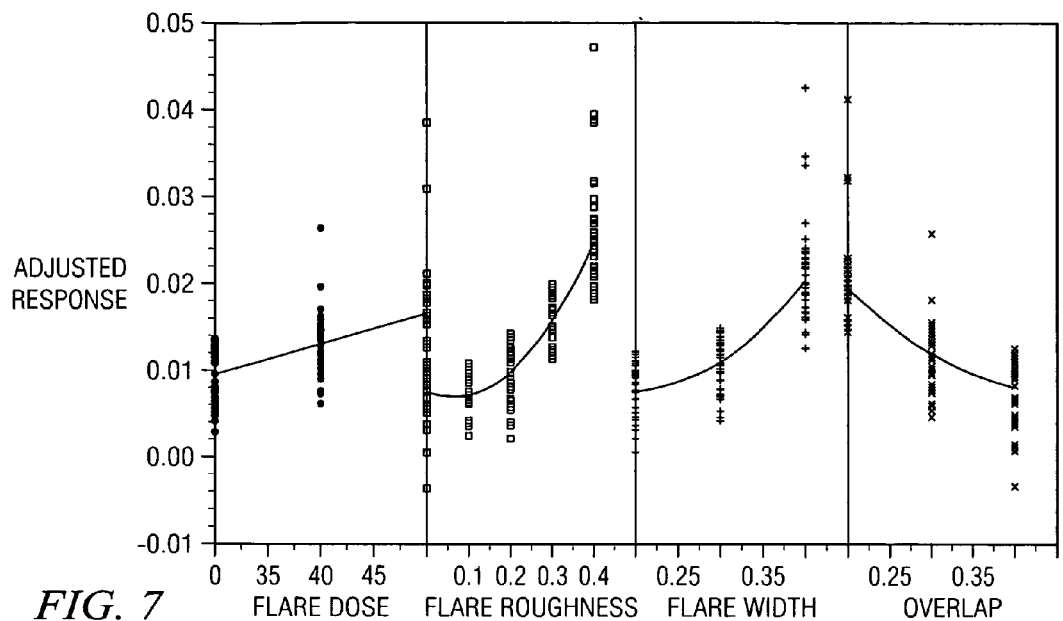
FIG. 7 shows simulated results of the double exposure shown in FIGS. 4 through 6.
Figure 8:
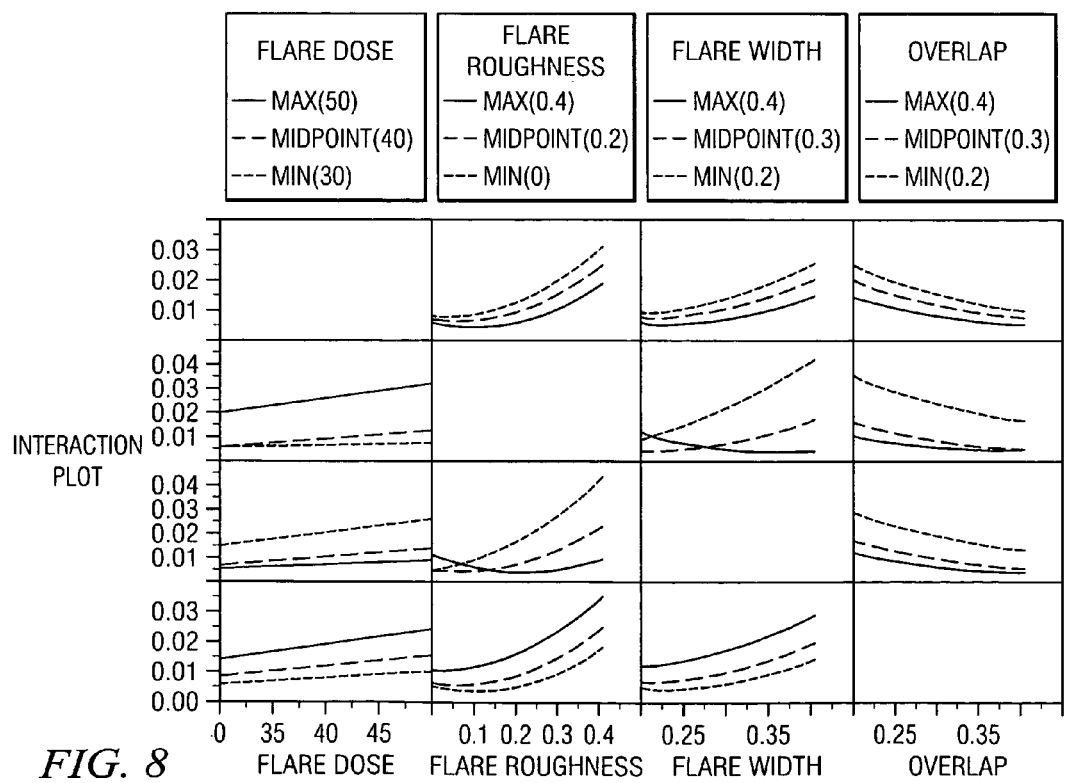
FIG. 8 shows an interaction plot for modeled effects of the double exposure shown in FIGS. 4 through 6.

Note that the "flare roughness" portion of the simulation results shown in FIG. 7 indicate that if the magnitude of the flare increases, the line shortening increases parabolically, indicating that the particular structure, in this embodiment, the first test pattern 316, is extremely sensitive to flare, which is desired. The "overlap" portion of the results indicate that if the overlap of the second test pattern 318 is increased, then the amount of measured line shortening decreases. Overall, all four portions of the simulation results indicate that the first test pattern 31 is sensitive to flare and thus can be used to measure it by determining the line shortening of features patterned on the resist.

Figure 9:
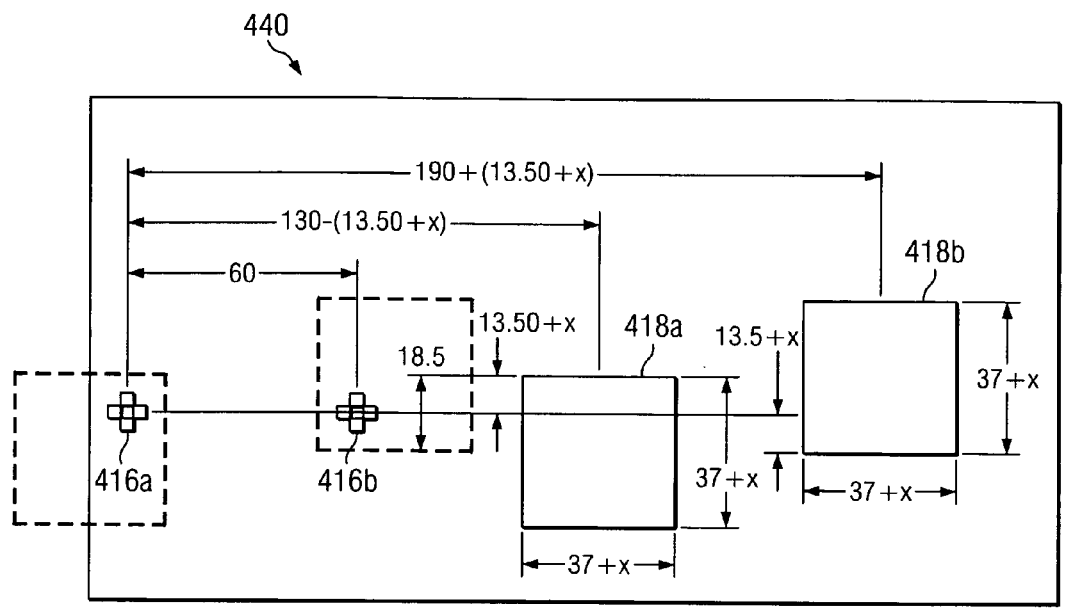
FIG. 9 shows a single lithography mask having two flare-sensitive test patterns and two opaque test patterns formed thereon in accordance with another embodiment of the present invention, wherein the single lithography mask may be used for the double exposure as described with reference to FIGS. 4 through 6.

FIG. 9 shows another embodiment of the present invention, which is another implementation of a double exposure flare structure that may be used to facilitate measurement of flare. Rather than using two separate masks as in the first embodiment shown in FIGS. 4 through 6, first test patterns 416a and 416b and second opaque test patterns 418a and 418b are disposed on the same single mask 440. In one embodiment, two first test patterns 416a and 416b are used, as well as two second opaque test patterns 418a and 418b, as shown, to minimize coma effects, to be described further herein. However, in another embodiment, only one first test pattern 416a and one second test pattern 418a is used (not shown), and the mask 440 is shifted over by the stepper in relation to the workpiece for the second exposure, to position the second test pattern 418a asymmetrically over the latent resist for the second exposure, as was described for the embodiment shown in FIGS. 4 through 6. The first and second test patterns 416a and 418a are preferably spaced far enough apart on the mask 440 so they do not optically interfere with one another.

In another embodiment, two first test patterns 416a and 416b and two second test patterns 418a and 418b are used, as shown in FIG. 9. Again, the first and second test patterns 416a and 416b, and 418a and 418b are preferably spaced far apart on the mask 440 so they do not optically interfere with one another. In the embodiment shown in FIG. 9, exemplary dimensions are given in µm; however, the first and second test patterns 416a, 416b, 418a, and 418b may comprise other dimensions and may be spaced apart by different dimensions, for example. In the embodiment shown, x=0, and the first test patterns 416a and 416b are spaced apart by about 60 µm. The second test patterns 418a and 418b comprise a length and width of about 37 µm, and are offset below and above the first test patterns 416a and 416b by about 13.5 µm, respectively. The two opaque or attenuated box test patterns 418a and 418b are placed a predetermined distance (offset by 13.5 in the embodiment shown), from each first test pattern 416a and 416b along a common axis. A resist is exposed using the two first test patterns 416a and 416b simultaneously.

After the first exposure, the mask 440 is shifted to the left, 130 µm in the embodiment shown, causing the latent leftmost grating structure formed in the resist (not shown) to be overlapped asymmetrically by the leftmost solid block or second test pattern 418a, as shown in phantom. The leftmost second test pattern 418a preferably has less overlap on the top and right portions of the leftmost latent grating structure on the resist than on the bottom and left. A misalignment is detected by an optical metrology tool; for example, the line shortening at the left and at the top of the test patterns formed in the resist is misinterpreted as a misalignment. Actually, advantageously, in accordance with embodiments of the present invention, the misalignment quantifies the amount of flare in the lithography system.

Preferably, in one embodiment, the grating structure to the right, the latent pattern formed by first test pattern 416b, is overlapped in exactly the opposite fashion by the second test pattern 418b, in order to isolate aberration effects. For example, the second test pattern 418b preferably has less overlap on the bottom and left portions of the latent pattern formed by first test pattern 416b than on the top and right portions.

Assuming that the overlaps of the second test patterns 418a and 418b over the features formed on a resist by the first test patterns 416a and 416b are sufficient so that optical exposure of the ends of the gratings are negligible in the absence of flare, then the effect of flare is the arithmetic average of the absolute measured misalignments in the horizontal and vertical directions, as shown in Equation 1:

$$\text{Effect of Flare(dose, focus, overlap)} = \Sigma |\text{misalignments}|/4 \qquad \text{Eq. 1}$$

For example, each structure (of the first and second test patterns) yields an x misalignment and a y misalignment, and the average x and y misalignment in the two different structures can be determined. If flare is present in the optical system, the exposure of a resist is asymmetric after the second exposure. In the presence of flare, the portions of the expose resist exposed to more scattered light or flare will experience line shortening, which can be measured to determine the amount of flare.

Figure 10:
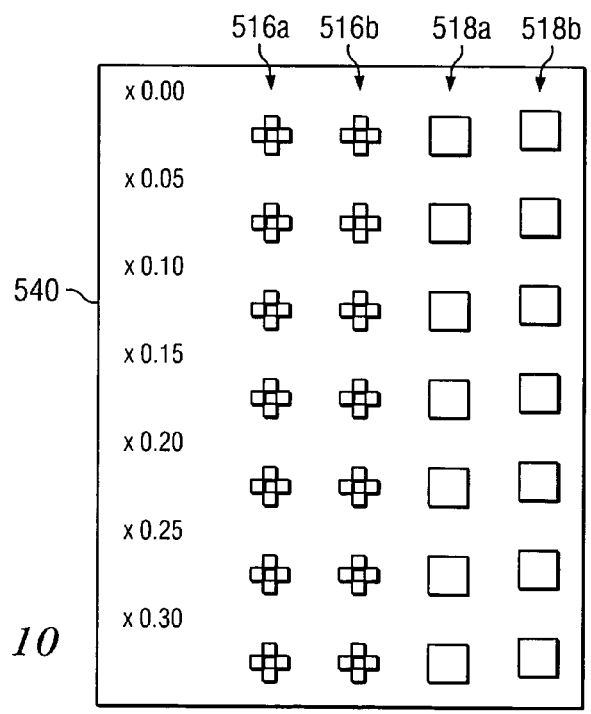
FIG. 10 shows another embodiment of the present invention, wherein a lithography mask comprises a plurality of sets of two flare-sensitive test patterns and two opaque test patterns which may be used to measure the effect of flare range and attenuation on line shortening.

FIG. 10 shows another embodiment of the present invention, wherein a plurality of sets of two first test patterns 516a and 516b comprising a grating structure are disposed on the same axis as a plurality of sets of two second test patterns 518a and 518b comprising opaque or attenuating structures on a single mask 540. Each set of two first test patterns 516a and 516b and two second test patterns 518a and 518b is positioned disposed as described with respect to the embodiment shown in FIG. 9, with the two second test patterns staggered 518a and 518b with respect to the first test patterns 516a and 516b to create an overlap and allow a double exposure in order to measure flare, by measuring line shortening on a resist of a workpiece (not shown; see FIG. 6).

The array of the sets of first and second test patterns 516a, 516b, 518a, and 518b may be constructed in one embodiment so that the overlap or amount of offset of the second test patterns 518a and 518b between the first exposure and the second exposure are different for each set; e.g., they may be varied from relatively small to large, e.g., about 0.01 μm to about 0.3 μm or larger. Then for each double exposure, the effect of the overlap can be quantified. By having each set of first and second test patterns 516a, 516b, 518a, and 518b have a different amount of overlap, the range effects of flare can be determined.

Other variables can be also studied in the embodiment shown in FIG. 10. For example, the first exposure can be repeated over a wafer at different focus settings. The second exposure can then quantify the effect of flare on focus. Another example is that the second exposure can vary the exposure dose, for example. Also, in this embodiment, as well as in the other embodiments, the mask 540 may comprise a chrome mask or phase shifting mask (PSM), e.g., an attenuated PSM.

Note that the effect of line shortening as measured by an optical measurement tool is not absolute and should preferably be calibrated using a technique having the required resolution such as by using a SEM. See Ziger, et. al, "Understanding Optical End of Line Metrology," Opt. Eng., Vol. 39, No. 7, pp. 1951–1957, July, 2000, which is incorporated herein by reference.

Figure 11:
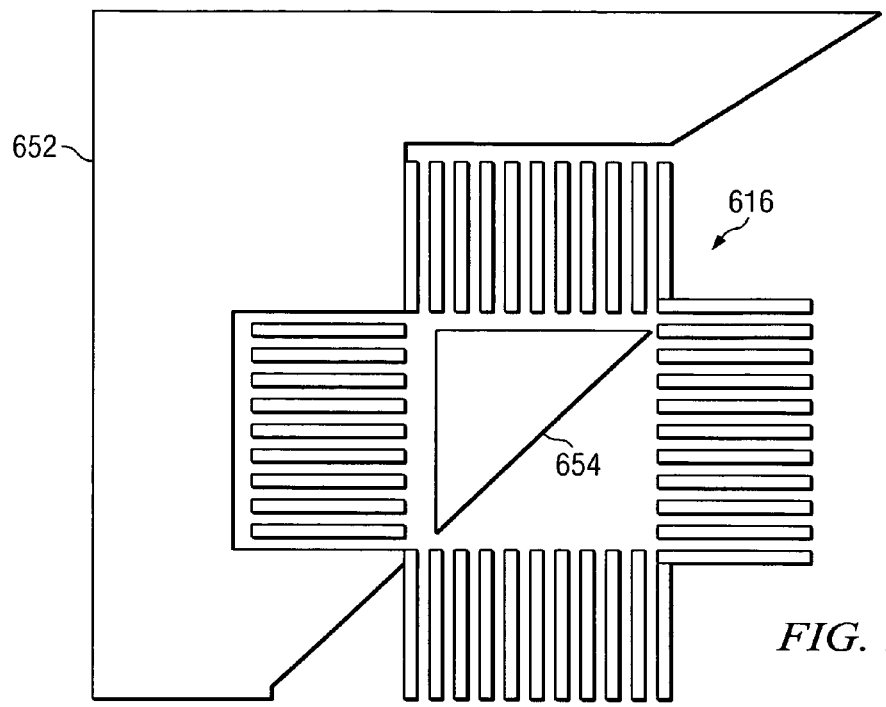
FIG. 11 shows another embodiment of the present invention, wherein a lithography mask comprises a flare-sensitive structure having an opaque test pattern close to a first portion of the flare-sensitive structure and farther away from a second portion of the flare-sensitive structure, that may be used to measure flare using a single exposure.

Embodiments of measuring the effects of flare using a single exposure in accordance with embodiments of the present invention will next be described. FIG. 11 shows a mask 650 having a pattern comprising a first test pattern 616 comprising a grating pattern as described with reference to the pattern 316 shown in FIG. 4, and an opaque test pattern 652 proximate one corner of the first test/grating pattern 616. The opaque test pattern 652 preferably is disposed proximate one row and column of gratings of the first test pattern 616, as shown. Preferably, a region of opaque test pattern 654 is also disposed within the center of the grating pattern 616, as shown. In this embodiment, preferably the opaque test patterns 652 and 654 are disposed proximate both ends of the gratings of the first test pattern 616, and are also disposed as much as possible around the sides of the ends of the gratings, as shown.

The mask 650 may be used to measure the relative effect of flare using a single exposure of a resist. Advantageously, only one exposure, and thus, only one mask, is required, in this embodiment. In the embodiment shown, the left and top gratings of the first test pattern 616 are in close proximity to large opaque test patterns or regions 652 and 654, whereas the right and bottom gratings of the first test pattern 616 are surrounded by large clear areas and are spaced farther away from the opaque test patterns 652 and 654. The triangular opaque pattern 654 in the center of the first test pattern 616 also has the effect of decreasing the light intensity on the ends of the lines of the top and right gratings. Consequently, flare will cause an apparent shift in the measured misalignment, and will cause line shortening of a pattern formed on a layer of resist on the corresponding top and left features. The bottom and right gratings formed on the resist can then be measured, and the top and left gratings formed on the resist can be measured, and the difference will determine the amount of flare in the lens of the optical system. Or, alternatively, the length of the top and left gratings on the resist may be compared to the length of the gratings of the first test pattern 616 of the mask 650.

The proximity of the opaque test patterns 652 and 654 to the gratings of the first test pattern 616 can be varied, e.g., from about 0.01 μm to about 0.4 μm, as examples. A plurality of patterns with similar features, including a test pattern 616 and opaque test patterns 652 and 654, with varying proximities of the opaque test patterns 652 and 654 to the test pattern 616 may be constructed on the same mask, in one embodiment (not shown).

If flare is present in the optical system, the exposure of a resist is asymmetric after the exposure using the mask 650. In the presence of flare, the portions of the resist exposed to more scattered light or flare, e.g., the features formed by the top row and left column of gratings of the pattern 616, will experience line shortening, which can be measured to determine the amount of flare by comparing to the grating dimensions of the mask 650 or by comparing to other features, e.g., features formed by the right column and bottom row of gratings of pattern 616, on the resist.

Figure 12:
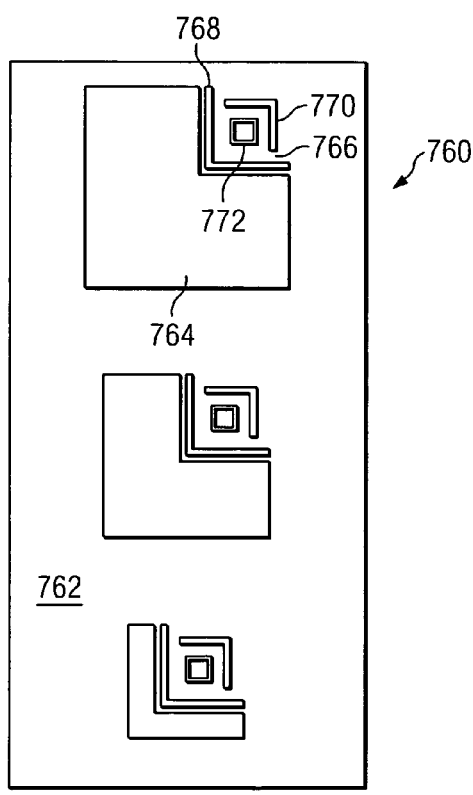
FIG. 12 shows yet another embodiment of the present invention, showing another pattern for a lithography mask that may be used to measure flare using a single exposure.
Figure 13:
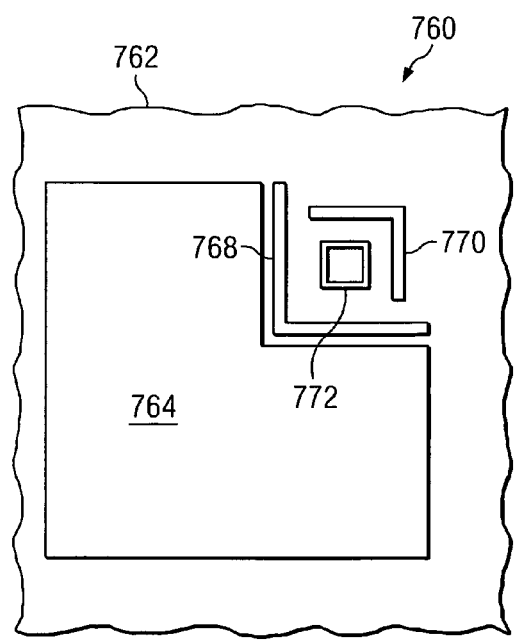
FIG. 13 shows a more detailed view of a portion of the lithography mask shown in FIG. 12.

Another embodiment of the present invention is shown in FIG. 12, and in further detail in FIG. 13. A single mask 750 and a single exposure are used to measure flare in this embodiment, without using a grating pattern. The mask 750 comprises a substantially large opaque region 762 comprising chrome, for example, with at least one clear window or transparent region 764 formed therein comprised of glass or quartz, for example. Each transparent region 764 is substantially square, as shown, with a patterned opaque region 766 in one corner of the transparent region 764. The patterned opaque region 766 includes an opaque region having two transparent trenches 768 and 770 formed therein, and a transparent frame 772 disposed within the trenches 768 and 770, as shown.

One trench 768 comprises an L-shape and is disposed closer to the transparent region or window 764, and the other trench 770 comprises an L-shape that is disposed closer to the opaque region 762, as shown. The two trenches 768 and 770 form an outer frame 768/770, and frame 772 comprises an inner frame 772; thus, the patterned region within the transparent region 764 comprises a frame 772 in a frame 768/770 structure. One trench, e.g., trench 768 in the embodiment shown, is surrounded by more clear area, e.g., transparent window 764, than the other trench 770, which is surrounded by more opaque area, e.g., opaque region 762.

A plurality of patterned opaque regions 766 may be formed within transparent regions 764, as shown, with the patterned opaque regions 766 comprising a plurality of different sizes.

The standard calculation of Image Log Slope (ILS) of an aerial image is shown in Equation 2 below.

$$ILS = d(ln/I)/dx|_x = (1/I)dI/dx|_x \qquad \text{Eq. 2}$$

where I is intensity of the image. Typically long-range flare is modeled using Equation 3 below.

$$I_{flare} = (1 - \%flare/100) * I_0 + \%flare/100 \qquad \text{Eq. 3}$$

where $I_{flare}$ is the normalized corrected intensity distribution, $I_0$ is the normalized original intensity, % flare is the flare in percent. The intensity is a dimensionless normalized intensity and the second term in the equation represents the DC contribution of the flare.

Substituting this into the ILS equation gives Equation 4:

Eq. 4:
$$ILS = d(\ln I_f)/dx\big|_x = \frac{1}{1+(f/1-f)} dI/dx\big|_x$$
where $f$ is % flare/100.

Effectively, increased flare decreases the ILS of the aerial image. This is exploited with the flare structure shown in FIGS. 12 and 13, in that for the trench 770 surround mostly by opaque region 762, the contribution of flare to the background intensity will be less than for the trench 768 in the proximity of the transparent region 764, as shown in more detail in FIG. 13. Consequently, flare will enlarge the bottom and left outer frames (e.g., trench 768), which will register as an alignment shift when the structure formed on a resist of a semiconductor wafer is measured with an optical overlay metrology tool. The overall shift will increase as the exposure dose increases, and the slope of the registration error through dose will be a measure of the local flare.

Embodiments of the present invention are useful in providing an improved ability to measure and monitor flare. Measurements may be made on a lithography system occasionally to determine if flare changes over time, which may indicate that a lens or other component needs servicing or replacement. One stepper can be compared to another stepper, to determine which stepper is the superior model, for example.

Advantages of embodiments of the invention include providing methods and structures for measuring the effects of flare on semiconductor lithography. The flare measurements may be made using a single exposure in some embodiments, or a double exposure, in other embodiments. A single mask may be used in one embodiment, or two masks may be used, in other embodiments. The methods described herein may be measured using commercially available optical alignment tools, such as the KLA Archer manufactured by KLA Instruments in Santa Clara, Calif., as an example, although alternatively, other measurement means may be used. An advantage of the embodiment shown in FIGS. 12 and 13 is that it does not require calibration to SEM, because a grating structure is not used for the test pattern.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   determining an amount of flare of a lithography system that includes at least one lens and at least one other component, the amount of flare determined by:
      providing a test workpiece, the test workpiece comprising a first layer of photosensitive material disposed thereon;
      exposing the first layer of photosensitive material to energy through at least one mask, the at least one mask comprising a first test pattern and a second test pattern disposed proximate a portion of the first test pattern, the second test pattern comprising an opaque or attenuated region;
      developing the first layer of photosensitive material; and
      measuring features formed on the first photosensitive material by the first test pattern proximate the second test pattern, wherein measuring the features formed on the layer of photosensitive material indicates the amount of flare of the lithography system;
   if the amount of flare exceeds a predetermined amount of flare, then servicing or replacing the at least one lens and/or the at least one other component of the lithography system;
   providing a semiconductor workpiece, the semiconductor workpiece having a second layer of photosensitive material disposed thereon;
   exposing the second layer of photosensitive material using the lithography system and a lithography mask;
   developing the second layer of photosensitive material; and
   using the second layer of photosensitive material to pattern a material layer of the second workpiece.

2. The method according to claim 1, wherein determining the amount of flare further comprises comparing the measurements of the features of the first layer of photosensitive material to a dimension of the first test pattern of the at least one mask.

3. The method according to claim 1, wherein determining the amount of flare further comprises comparing the measurements of the features of the first layer of photosensitive material formed by the first test pattern proximate the second test pattern to a measurement of features formed on the first layer of photosensitive material by the first test pattern spaced apart from the second test pattern.

4. The method according to claim 1, wherein determining the amount of flare further comprises:
   providing a first mask, the first mask comprising the first test pattern, wherein the first test pattern includes a plurality of gratings;
   providing a second mask, the second mask comprising the second test pattern;
   exposing the first layer of photosensitive material to energy through the first mask, forming latent features on the first layer of photosensitive material;
   aligning the second mask asymmetrically to the latent features formed on the first layer of photosensitive material; and
   exposing the first layer of photosensitive material to energy through the second mask.

5. The method according to claim 4, wherein providing the first mask comprises providing a mask comprising a first test pattern comprising a top row of opaque gratings, a bottom row of opaque gratings, a left column of opaque gratings, and a right column of opaque gratings, and wherein providing the second mask comprises providing a mask having a second test pattern comprising an opaque or attenuated pattern that is larger than the first test pattern.

6. The method according to claim 5, wherein aligning the second mask asymmetrically comprises aligning the second mask closer to one corner of the plurality of gratings.

7. The method according to claim 1, wherein determining the amount of flare comprises exposing the first layer of photosensitive material using a single mask.

8. The method according to claim 7, wherein exposing the first layer of photosensitive material comprises using the single mask having a first region comprising the first test pattern and a second region comprising the second test pattern, wherein the first test pattern comprises a plurality of gratings, further comprising:
    exposing the first layer of photosensitive material to energy through the first region of the single mask, forming latent features on the first layer of photosensitive material;
    aligning the second region of the single mask asymmetrically to the latent features formed on the first layer of photosensitive material; and
    exposing the first layer of photosensitive material to energy through the second region of the single mask.

9. The method according to claim 8, wherein using the single mask comprises providing a mask comprising the first test pattern comprising a top row of opaque gratings, a bottom row of opaque gratings, a left column of opaque gratings, and a right column of opaque gratings, and wherein the second test pattern comprises an opaque or attenuated pattern larger than the first test pattern.

10. The method according to claim 9, wherein aligning the second region of the single mask asymmetrically comprises aligning the single mask closer to one corner of the plurality of gratings.

11. The method according to claim 9, wherein providing the mask comprises providing a mask having two first test patterns in the first region, and two second test patterns in the second region, wherein the first test patterns and the second test patterns are aligned on a common axis.

12. The method according to claim 11, wherein providing the mask comprises providing a mask having one second test pattern offset towards a first corner of one of the first test patterns, and one second test pattern offset towards a second corner of one of the first test patterns, the first corner being different from the second corner.

13. The method according to claim 9, wherein providing the mask comprises providing a mask having a plurality of sets of test patterns, each set of test patterns comprising two first test patterns in the first region and two second test patterns in the second region, wherein the first test patterns and the second test patterns of each set of test patterns are aligned on a common axis.

14. The method according to claim 13, wherein providing the mask comprises providing a mask wherein each of the plurality of sets of test patterns comprises one second test pattern offset towards a first corner of one of the first test patterns, and one second test pattern offset towards a second corner of one of the first test patterns, the first corner being different from the second corner.

15. The method according to claim 7, wherein exposing the first layer of photosensitive material using a single mask comprises providing a mask comprising the first test pattern comprising a top row of opaque gratings, a bottom row of opaque gratings, a left column of opaque gratings, and a right column of opaque gratings, and the second test pattern comprising an opaque pattern disposed proximate one corner of rows and columns of the opaque gratings of the first test pattern.

16. The method according to claim 15, wherein exposing the first layer of photosensitive material using a single mask comprises providing a mask comprising the second test pattern further comprising an opaque pattern disposed within a central region of the rows and columns of the opaque gratings of the first test pattern.

17. The method according to claim 7, wherein exposing the first layer of photosensitive material using a single mask comprises providing a mask comprising a transparent region, wherein the first test pattern comprises a first frame and a second frame, the first frame and second frame comprising transparent regions formed in an opaque material, the first frame being disposed within the second frame, wherein the second frame comprises a first L-shaped trench disposed proximate the transparent region and a second L-shaped trench disposed proximate the opaque region of the second test pattern.

18. The method according to claim 17, wherein providing the mask comprises providing a mask comprising a plurality of first test patterns, each first test pattern comprising a different dimension from another first test pattern.

19. A lithography mask, comprising:
    a transparent material; and
    an opaque material disposed over the transparent material, the opaque material comprising two first test patterns in a first region and two second test patterns in a second region, wherein the first test patterns and the second test patterns are aligned on a common axis and wherein the first test patterns each comprise a plurality of gratings including a top row of opaque gratings, a bottom row of opaque gratings, a left column of opaque gratings, and a right column of opaque gratings, and the second test patterns each comprise an opaque or attenuated region, wherein the second test patterns provide a measurement of flare to a feature formed on a layer of photoresist by the first test patterns.

20. The lithography mask according to claim 19, wherein each second test pattern comprises an opaque or attenuated region larger than each of the first test patterns, wherein the lithography mask is adapted to be moved to cover the feature formed on the layer of photoresist with at least one of the first test patterns asymmetrically.

21. The lithography mask according to claim 20, wherein the lithography mask is adapted to be moved to align to cover the feature formed on the layer of photoresist with at least one of the first test patterns closer to one corner of the plurality of gratings.

22. The lithography mask according to claim 19, wherein the mask comprises one second test pattern offset towards a first corner of one of the first test patterns, and one second test pattern offset towards a second corner of one of the first test patterns, the first corner being different from the second corner.

23. The lithography mask according to claim 19, wherein each second test pattern is disposed proximate a portion of each first test pattern.

24. The lithography mask according to claim 23, wherein the lithography mask comprises a transparent region, wherein each first test pattern comprises a first frame and a second frame, the first frame and second frame comprising transparent regions formed in an opaque material, the first frame being disposed within the second frame, wherein the second frame comprises a first L-shaped trench disposed proximate the transparent region and a second L-shaped trench disposed proximate an opaque region of each at least one second test pattern.

25. The lithography mask according to claim 24, wherein each first test pattern comprises a different dimension from another first test pattern.

26. The lithography mask according to claim 19, wherein each second test pattern further comprises an opaque region disposed within a central region of the rows and columns of the opaque gratings of each of the first test patterns.

27. A lithography system implementing the lithography mask according to claim 19.

28. A lithography system, comprising:
   a first mask comprising a first test pattern, the first test pattern comprising a plurality of gratings;
   a second mask comprising a second test pattern, the second test pattern comprising an opaque or attenuated region;
   an energy source for exposing the photosensitive material on the workpiece to the first test pattern of the first mask and the second test pattern of the second mask; and
   a stepper for positioning the first mask and second mask over a workpiece, the workpiece having a layer of photosensitive material disposed thereon, wherein the stepper is adapted to position the second test pattern of the second mask asymmetrically over features formed on the layer of photosensitive material by the first test pattern of the first mask, wherein features formed on the photosensitive material may be measured to determine the effect of flare in the lithography system.

29. The lithography system according to claim 28, further comprising means for measuring the features formed on the photosensitive material.

30. The lithography system according to claim 29, further comprising means for comparing the measured features formed on the photosensitive material to a dimension of the first test pattern of the first mask, or to a dimension of features formed on the photosensitive material unaffected by the effect of flare.

31. The lithography system according to claim 28, wherein the first test pattern of the first mask comprises a top row of opaque gratings, a bottom row of opaque gratings, a left column of opaque gratings, and a right column of opaque gratings, and wherein the second test pattern of the second mask comprises an opaque or attenuated region larger than the first test pattern.

32. The lithography system according to claim 28, wherein the stepper is adapted to align the second test pattern of the second mask closer to one corner of the plurality of gratings than the other corners of the plurality of gratings.

* * * * *